United States Patent
Uang et al.

(10) Patent No.: US 10,564,680 B1
(45) Date of Patent: Feb. 18, 2020

(54) ELECTRONIC DEVICE AND CLICK PAD THEREOF

(71) Applicant: CHICONY ELECTRONICS CO., LTD., New Taipei (TW)

(72) Inventors: Kuang-Shen Uang, New Taipei (TW); Chia-Wei Chang, New Taipei (TW); Guo-Yu Shi, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/233,823

(22) Filed: Dec. 27, 2018

(30) Foreign Application Priority Data

Aug. 9, 2018 (TW) .............................. 107127845 A

(51) Int. Cl.
| | |
|---|---|
| *G06F 1/16* | (2006.01) |
| *H05K 1/02* | (2006.01) |
| *G06F 3/0354* | (2013.01) |

(52) U.S. Cl.
CPC ........ *G06F 1/1656* (2013.01); *G06F 3/03547* (2013.01); *H05K 1/0215* (2013.01)

(58) Field of Classification Search
CPC .. G06F 1/1656; G06F 3/03547; H05K 1/0215
See application file for complete search history.

(56) References Cited

U.S. PATENT DOCUMENTS

| | | | | |
|---|---|---|---|---|
| 2015/0160750 A1* | 6/2015 | Wu | ......................... | G06F 3/016 345/173 |
| 2016/0266617 A1* | 9/2016 | Shen | ..................... | G06F 1/1692 |
| 2017/0255230 A1* | 9/2017 | Regimbal | ............... | G06F 1/169 |

FOREIGN PATENT DOCUMENTS

TW          M564756 U        8/2018

* cited by examiner

*Primary Examiner* — Rockshana D Chowdhury
(74) *Attorney, Agent, or Firm* — Muncy, Geissler, Olds & Lowe, P.C.

(57) ABSTRACT

A click pad which is applied to an electronic device includes a top board, a circuit board, a metal elastic board, a conductive connection layer, a bottom bracket and a restoration unit. The circuit board is located under the top board and connected to the top board. The metal elastic board under the circuit board includes a metal elastic board main body and a connection part. A buffer gap is formed between the metal elastic board main body and the circuit board. The connection part connects to the metal elastic board main body. The conductive connection layer connects to the circuit board and the connection part. The bottom bracket under the metal elastic board includes a protruding part. The protruding part supports the metal elastic board main body. The restoration unit supports the circuit board.

8 Claims, 5 Drawing Sheets

ELECTRONIC DEVICE AND CLICK PAD THEREOF

BACKGROUND OF THE INVENTION

1. Field of the Invention

The present invention relates to a click pad; more particularly, the present invention relates to a click pad which has a streamlined structure such that the click pad is easy and fast to produce.

2. Description of the Related Art

A common notebook computer usually has a click pad located below the keyboard board for allowing the user to use a finger to press the click pad or slide on the click pad to give a touch instruction to the notebook computer. When producing the click pad, a worker has to use an adhesive or fastener to combine the glass panel, the circuit board, the dome sheet and the bottom bracket to assemble the click pad, and also has to install an additional grounding metal strip between the circuit board and the bottom bracket so that excess electricity can be transferred to the outside of the click pad via the grounding metal strip.

However, the production process of combining the glass panel, the circuit board, the restoration unit and the bottom bracket is very complicated. Moreover, installing the additional grounding metal strip also increases the production cost and assembly time.

Therefore, there is a need to provide a new click pad which has a streamlined structure such that the click pad is easy and fast to produce.

SUMMARY OF THE INVENTION

It is an object of the present invention to provide a click pad which has a streamlined structure such that the click pad is easy and fast to produce.

To achieve the abovementioned object, a click pad of the present invention is applied to an electronic device. The electronic device includes an upper case and a lower case. The click pad includes a top board, a circuit board, a metal elastic board, at least one conductive connection layer, a bottom bracket and a restoration unit. The top board is located under the upper case. The circuit board is located under the top board and connected to the top board. The metal elastic board is located under the circuit board. The metal elastic board includes a metal elastic board main body and at least one connection part. A buffer gap is formed between the metal elastic board main body and the circuit board. The connection part is connected to the metal elastic board main body. The conductive connection layer is connected to the connection part and the circuit board. The bottom bracket is located under the metal elastic board and located above the lower case. The bottom bracket includes at least one protruding part. The protruding part supports the metal elastic board main body. The restoration unit supports the circuit board.

According to one embodiment of the present invention, the bottom bracket further includes at least one hole, and the hole is located on the protruding part.

According to one embodiment of the present invention, the click pad further includes at least one ground solder pad, and the ground solder pad passes through the hole to connect to the metal elastic board main body.

According to one embodiment of the present invention, the click pad further includes a first adhesive layer, and the first adhesive layer is located between the top board and the circuit board.

According to one embodiment of the present invention, the click pad further includes a second adhesive layer, and the second adhesive layer is located between the protruding part and the metal elastic board main body.

According to one embodiment of the present invention, the conductive connection layer is a solder paste attached on the connection part by Surface-Mount Technology.

Another object of the present invention is to provide an electronic device, which has a click with a streamlined structure such that the click pad is easy and fast to produce.

To achieve the abovementioned object, an electronic device of the present invention includes an upper case, a lower case and a click pad. The click pad includes a top board, a circuit board, a metal elastic board, at least one conductive connection layer, a bottom bracket and a restoration unit. The top board is located under the upper case. The circuit board is located under the top board and connected to the top board. The metal elastic board is located under the circuit board. The metal elastic board includes a metal elastic board main body and at least one connection part. A buffer gap is formed between the metal elastic board main body and the circuit board. The connection part is connected to the metal elastic board main body. The conductive connection layer is connected to the connection part and the circuit board. The bottom bracket is located under the metal elastic board and located above the lower case. The bottom bracket includes at least one protruding part. The protruding part supports the metal elastic board main body. The restoration unit supports the circuit board.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
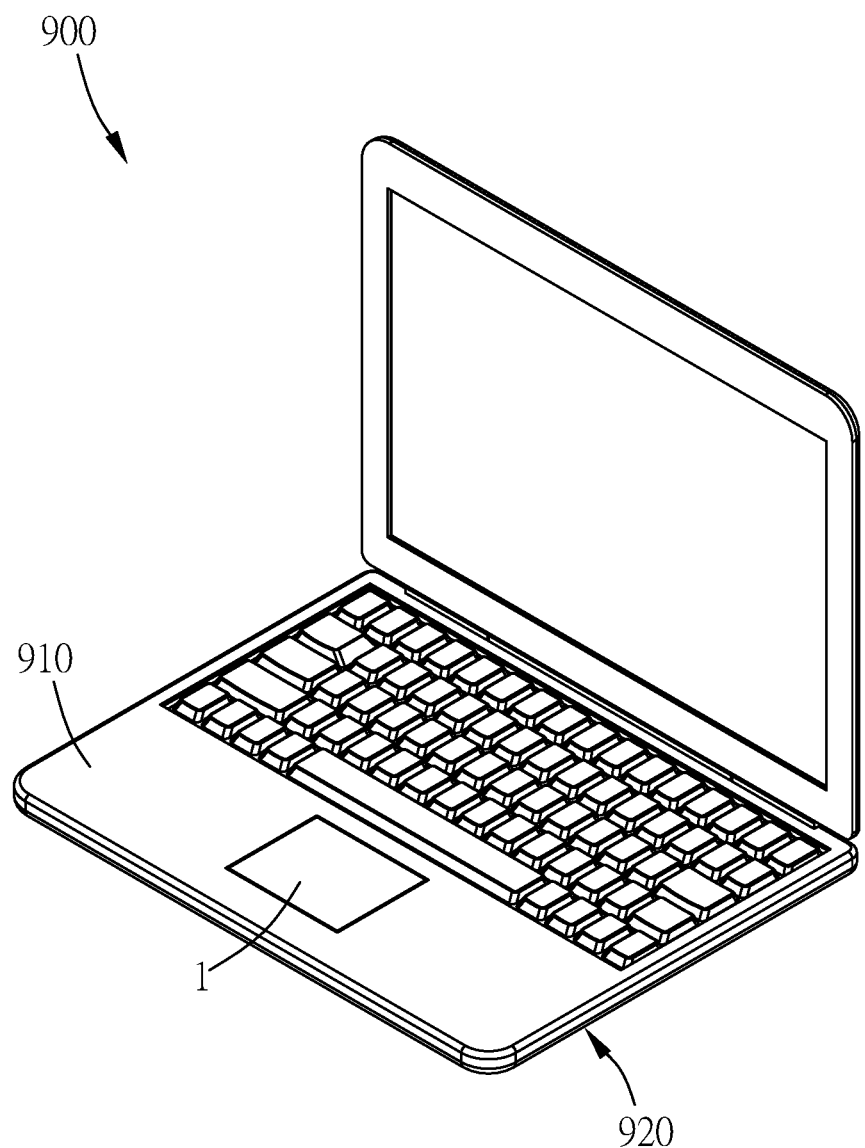
FIG. 1 illustrates a schematic drawing of the electronic device in the first embodiment of the present invention.
Figure 2:
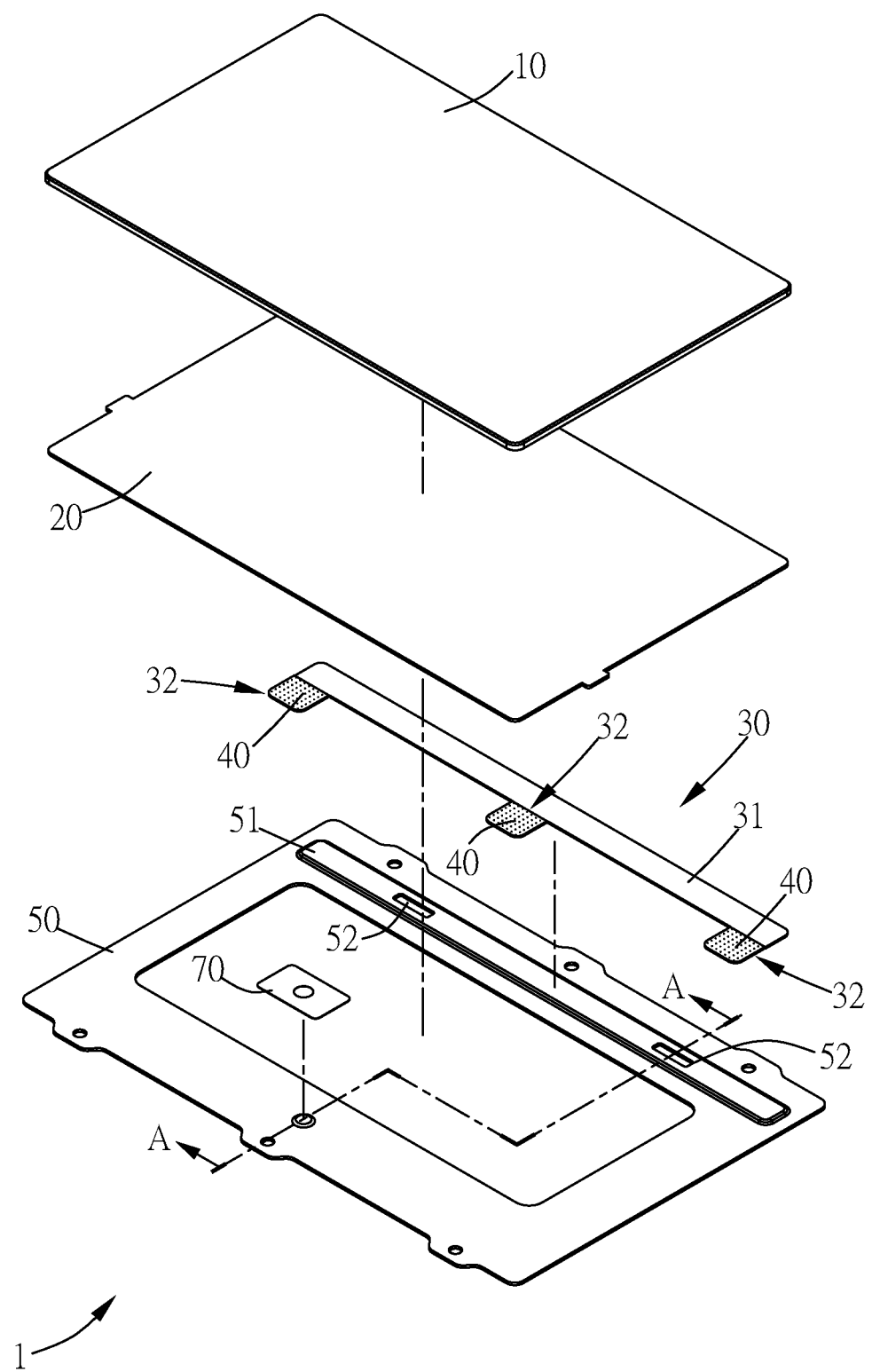
FIG. 2 illustrates an exploded drawing of the click pad in the first embodiment of the present invention.
Figure 3:
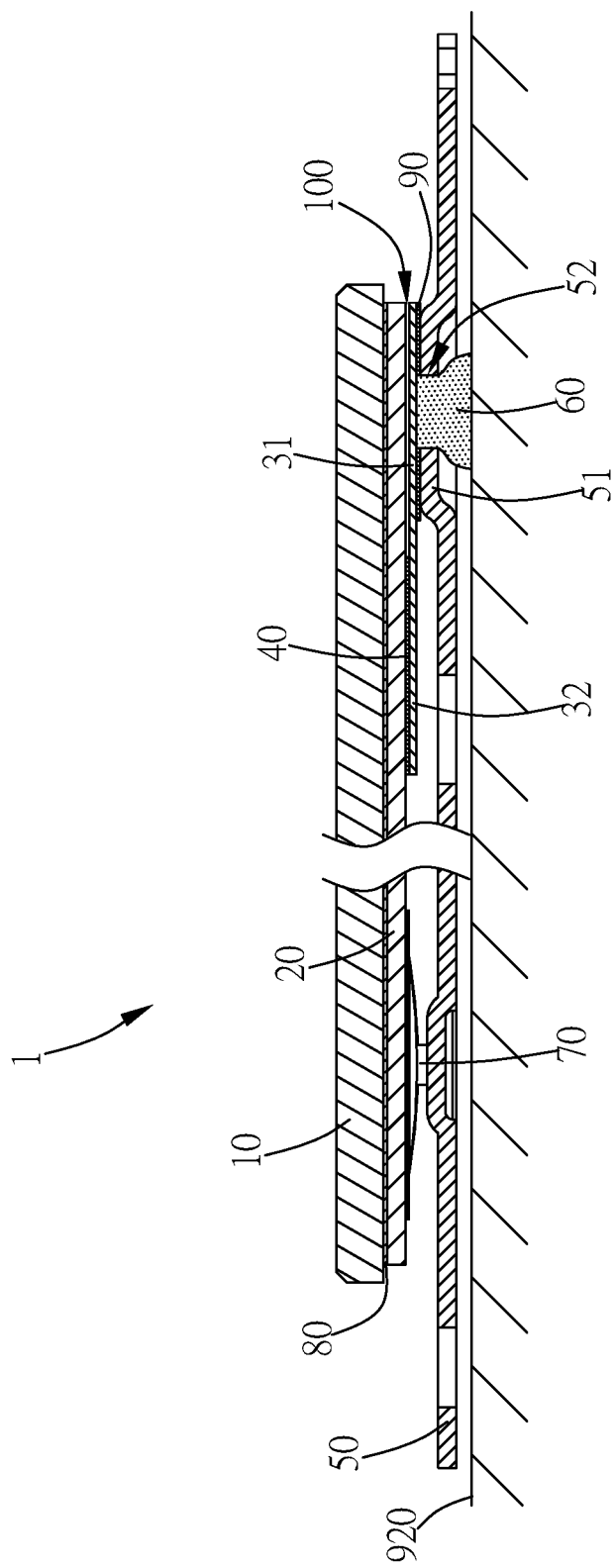
FIG. 3 illustrates a sectional view of the click pad in the first embodiment of the present invention along the section line AA shown in FIG. 2.
Figure 4:
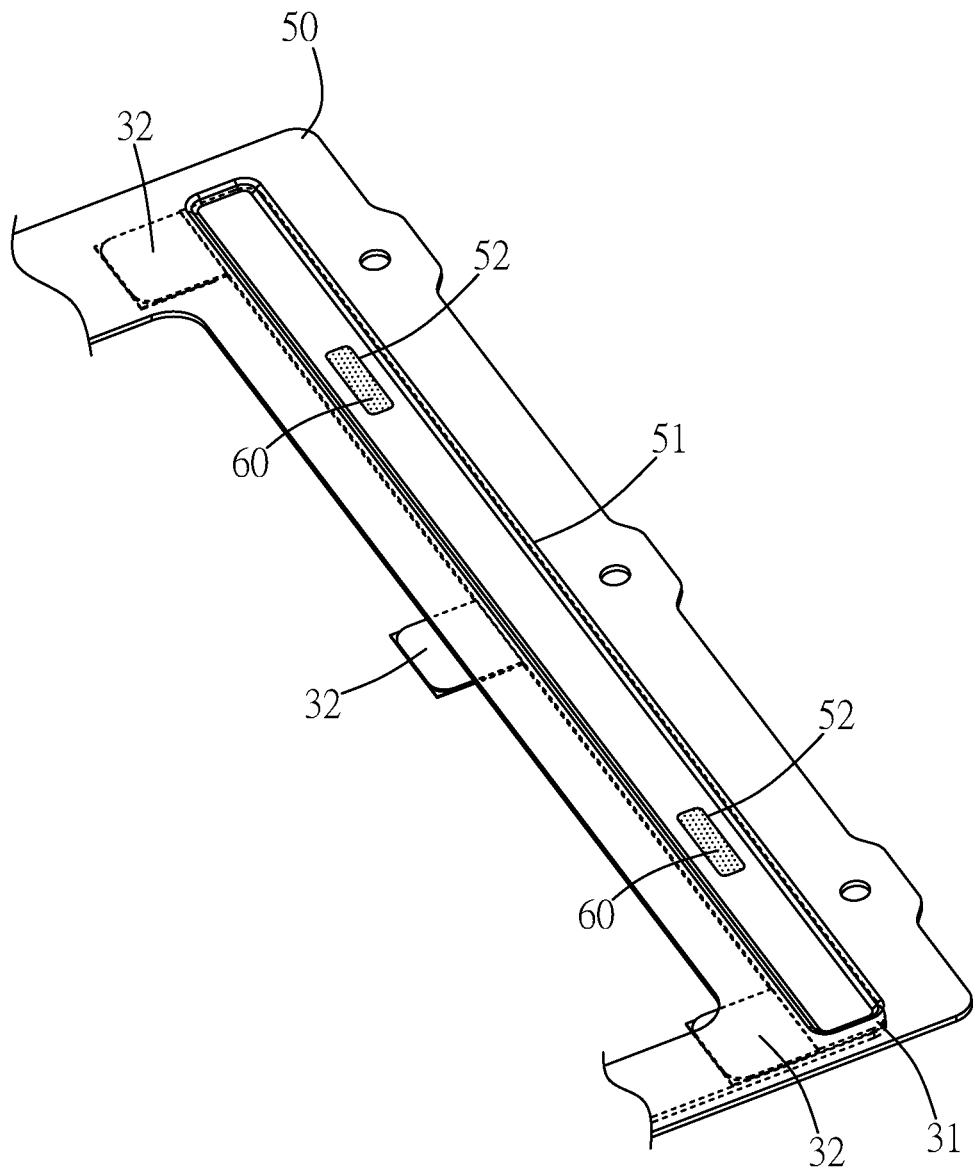
FIG. 4 illustrates a bottom schematic drawing of the bottom bracket when the metal elastic board main body and the protruding part are combined in the first embodiment of the present invention.

Please refer to FIG. 1 to FIG. 4, which illustrate the electronic device and the click pad thereof in the first embodiment of the present invention. FIG. 1 illustrates a schematic drawing of the electronic device in the first embodiment of the present invention. FIG. 2 illustrates an exploded drawing of the click pad in the first embodiment of the present invention. FIG. 3 illustrates a sectional view of the click pad in the first embodiment of the present invention along the section line AA shown in FIG. 2. FIG. 4 illustrates a bottom schematic drawing of the bottom bracket when the metal elastic board main body and the protruding part are combined in the first embodiment of the present invention.

As shown in FIG. 1 to FIG. 3, in the first embodiment of the present invention, the click pad 1 is a flat plate with touching and pressing function. The click pad 1 has a streamlined structure which is easy and fast to produce such that this structure of click pad 1 can save the manufacturing cost and time. The click pad 1 is applied to an electronic device 900. The electronic device 900 of this embodiment is a notebook computer, which has an upper case 910 and a lower case 920. The click pad 1 is embedded in the upper case 910 and located above the lower case 920. The user can use a finger to operate the click pad 1 which is exposed out of the upper case 910. The click pad 1 includes a top board 10, a circuit board 20, a metal elastic board 30, three conductive connection layers 40, a bottom bracket 50, two ground solder pads 60, a restoration unit 70, a first adhesive layer 80 and a second adhesive layer 90.

In the first embodiment of the present invention, the top board 10 is under the upper case 910. The top board 10 can be a glass board, a metal board or a plastic board. The top board 10 is used for allowing the user to use a finger to press, slide or touch, and the top board 10 can also cover and protect the other components of the click pad 1. The circuit board 20 is located under the top board 10 and connected to the top board 10. The circuit board 20 is used for providing the function of sensing a touch to sense the touch action of the user's finger on the top board 10; however, the principle of sensing a touch of the circuit board 20 is already disclosed in the art of touch technology, it is not the focus of the present invention, and there is no need for furthermore description.

In the first embodiment of the present invention, the metal elastic board 30 is located under the circuit board 20 and close to one side of the circuit board 20. The thickness of the metal elastic board 30 is between 0.05 and 0.2 millimeter, but the thickness can be changed according to design requirements. The metal elastic board 30 includes a metal elastic board main body 31 and three connection parts 32. The metal elastic board main body 31 is a flexible metal long strip. The long strip structure and elasticity of the metal elastic board main body 31 can reduce the deformation effect caused by compression of the assembly. A buffer gap 100 is formed between the metal elastic board main body 31 and the circuit board 20. The three connection parts 32 are connected to the metal elastic board main body 31 and combine with the circuit board 20 via the conductive connection layer 40. However, the amount of the connection parts 32 is not limited to three; the amount can be changed to one or more according to design requirements.

In the first embodiment of the present invention, the bottoms of the three conductive connection layers 40 (which are shown as the dotted area on the three connection parts 32 shown in FIG. 2) are connected to the three connection parts 32, and the tops of the three conductive connection layers 40 are connected to the circuit board 20. Each of the conductive connection layers 40 is attached with a solder paste to the connection parts 32 by Surface-Mount Technology (SMT); however, the amount and the type of the connection parts 32 and the method of attaching the connection parts 32 on the conductive connection layer 40 are not limited to the above-mentioned description; for example, the conductive connection layer 40 can also be another kind of metal paste attached on the connection parts 32 via welding, and the amount of the conductive connection layer 40 can be changed according to the amount of the connection parts 32. In one embodiment which is not shown in the drawing, the metal elastic board 30 has only two connection parts 32, and the metal elastic board 30 is a flexible U-shaped metal slice.

In the first embodiment of the present invention, the bottom bracket 50 is located under the metal elastic board 30 and above the lower case 920. The bottom bracket 50 includes a protruding part 51 and two holes 52. The protruding part 51 is a protruding structure formed via stamping the flat area of the bottom bracket 50. The protruding part 51 supports the metal elastic board main body 31. The protruding part 51 enhances the rigidity of the overall structure, raises the components stacked on the protruding part 51 and creates a hollow space, allowing the click pad 1 to achieve the cantilever effect and the pressing function; however, the principle of the pressing function is already disclosed in the art of touch technology and is not the focus of the present invention, so there is no need for furthermore description. The two holes 52 are located on the protruding part 51, and each of the holes 52 is used for containing the ground solder pad 60.

As shown in FIG. 3 and FIG. 4, in the first embodiment of the present invention, the two ground solder pads 60 respectively pass through the two holes 52 and connect to the metal elastic board main body 31. The two ground solder pads 60 are formed via filling solder into each of the holes 52; the solder of the ground solder pad 60 in the hole 52 combines the hole 52 and the metal elastic board main body 31 to enhance the combination between the metal elastic board 30 and the bottom bracket 50. Because the metal material of the conductive connection layer 40 and the metal elastic board 30 are both conductive, the excess electricity of the circuit board 20 can be transferred to the ground solder pad 60 via the electrical connection between the conductive connection layer 40 and the metal elastic board 30; the ground solder pad 60 can transfer the excess electricity to the outside to provide a grounding function. Furthermore, because the ground solder pad 60 is located in the bottom bracket 50, the ground solder pad 60 will not occupy additional space in the electronic device 900.

As shown in FIG. 2 and FIG. 3, in the first embodiment of the present invention, the restoration unit 70 supports the circuit board 20. When the user uses a finger to press the top board 10, then the top board 10 and the circuit board 20, via the cantilever principle, will tilt downwardly on an axis which is the connection point of the metal elastic board main body 31 and the protruding part 51, and the buffer gap 100 provides a buffer function to prevent the pressing force causing excessive deformation of the overall structure; when the user no longer presses the click pad 1, the restoration unit 70 supports the circuit board 20 and the top board 10 via elasticity such that the circuit board 20 and the top board 10 return to the original position; in a preferred embodiment, the restoration unit 70 is a dome sheet, but the type of the restoration unit 70 is not limited to that design, and the restoration unit 70 can be another elastic component which can provide a restoration force.

As shown in FIG. 3, in the first embodiment of the present invention, the first adhesive layer 80 is a grid adhesive. The first adhesive layer 80 is located between the top board 10 and the circuit board 20. The first adhesive layer 80 is used for stably combining the top board 10 and the circuit board 20. The second adhesive layer 90 is a hot glue or an adhesive. The second adhesive layer 90 is located between the protruding part 51 and the metal elastic board main body 31. The second adhesive layer 90 is used for stably combining the protruding part 51 and the metal elastic board main body 31. In a preferred embodiment, the second adhesive layer 90 is not located on the hole 52 such that the second adhesive layer 90 will not interfere with the transfer of electricity of the ground solder pad 60.

As shown in FIG. 2 to FIG. 4, when assembling the click pad 1 in the first embodiment of the present invention, first, during the Surface-Mount Technology processing for the circuit board 20, the assembly staff can also execute the Surface-Mount Technology processing to the connection parts 32 such that the three conductive connection layers 40 are respectively attached on the three connection parts 32; therefore, the production processing and time can be saved. Then the assembly staff can combine the three connection parts 32 and the circuit board 20 via the conductive connection layers 40, and the buffer gap 100 is formed between the metal elastic board main body 31 and the circuit board 20. Then the assembly staff can put the first adhesive layer 80 on the bottom face of the top board 10 and put the top board 10 and the first adhesive layer 80 on the circuit board 20 such that the top board 10 and the circuit board 20 are stably combined by the first adhesive layer 80. Then the assembly staff can connect the restoration unit 70 to the bottom face of the circuit board 20 with the adhesive. Then the assembly staff can put the second adhesive layer 90 on the protruding part 51 without letting the second adhesive layer 90 contact the hole 52 and put the metal elastic board main body 31 on the second adhesive layer 90 and the protruding part 51 such that the protruding part 51 and the metal elastic board main body 31 are stably combined by the second adhesive layer 90. Finally, the assembly staff can fill the solder into each of the holes 52 to form the ground solder pad 60 in the hole 52 such that the ground solder pad 60 in the hole 52 can combine with the hole 52 and the metal elastic board main body 31; thereby, the assembly of the click pad 1 is completed. Because the components of the click pad 1 are superposed on each other and connected to each other along the Z axis (wherein the Z axis is the direction which is perpendicular to the plane of the top board 10), then during the assembly process, the assembly staff can easily stack the components of the click pad 1 along the Z axis or operate an automatable machine to easily execute the stacking action of the components of the click pad 1 along the Z axis to further improve the assembly efficiency.

Figure 5:
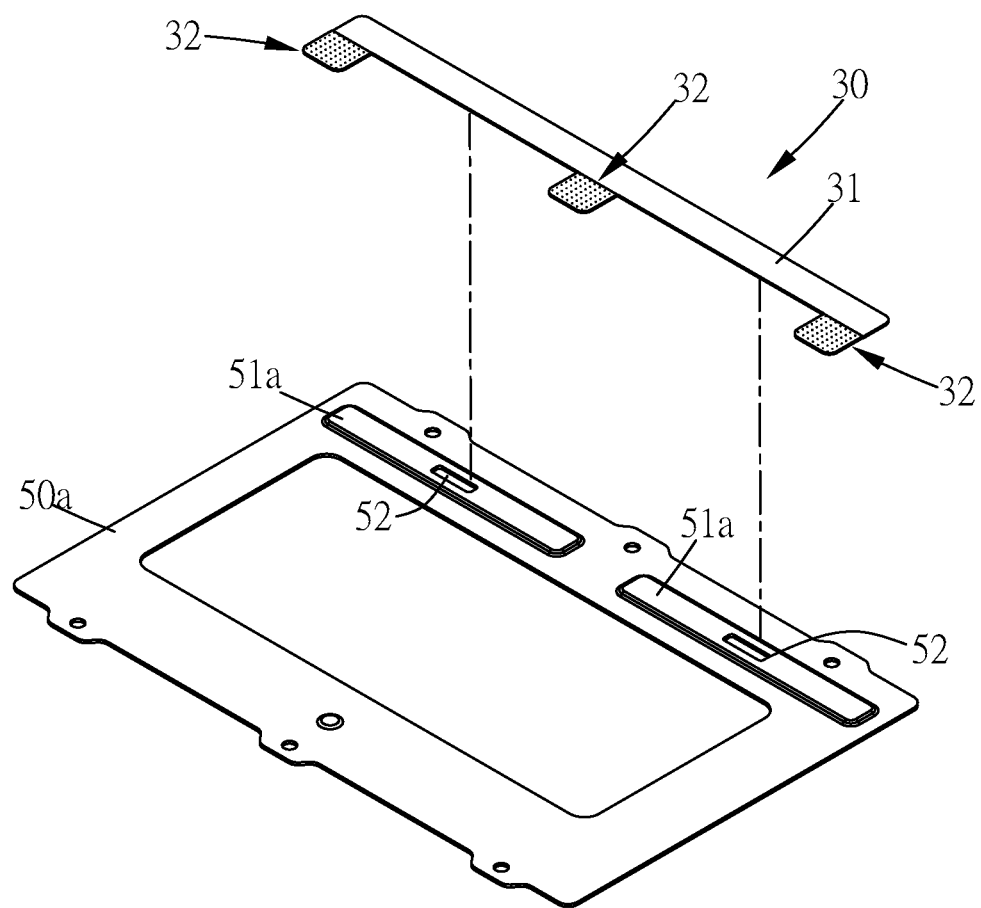
FIG. 5 illustrates a schematic drawing of the metal elastic board and the bottom bracket in the second embodiment of the present invention.

Please refer to FIG. 5, which illustrates the electronic device and the click pad thereof in the second embodiment of the present invention. FIG. 5 illustrates a schematic drawing of the metal elastic board and the bottom bracket in the second embodiment of the present invention.

As shown in FIG. 5, the difference between the second embodiment and the first embodiment is that, in the second embodiment, the bottom bracket 50a includes two protruding parts 51a, and the two holes 52 are respectively located on the two protruding parts 51a. The two protruding parts 51a are both located under the metal elastic board main body 31. The two protruding parts 51a enhance the rigidity of the overall structure. However, the amount of the protruding parts 51a is not limited to the abovementioned description, and the amount can be changed according to design requirements.

Via the design of the click pad in the present invention, there is no need to install an additional grounding metal strip for the click pad, and the assembly staff can easily drill a hole in the bottom bracket and fill the ground solder pad into the hole to achieve the grounding effect; therefore, the cost of the grounding metal strip can be saved; furthermore, because the ground solder pad is located in the bottom bracket, the ground solder pad does not occupy extra space in the electronic device. In addition, the components of the click pad are superposed on each other and connected to each other along the Z axis such that during the assembly process, the assembly staff can stack the components of the click pad along the Z axis or operate an automatable machine to easily execute the stacking action of the components of the click pad along the Z axis to easily and quickly assemble the click pad.

What is claimed is:

1. A click pad, applied to an electronic device, the electronic device comprising an upper case and a lower case, the click pad comprising:
   a top board, located under the upper case;
   a circuit board, located under the top board and connected to the top board;
   a metal elastic board, located under the circuit board, wherein the metal elastic board comprises:
      a metal elastic board main body, wherein a buffer gap is formed between the metal elastic board main body and the circuit board, and the buffer gap provides a buffer function to prevent a pressing force causing an excessive deformation; and
      at least one connection part, connected to the metal elastic board main body;
   at least one conductive connection layer, connected to the at least one connection part and the circuit board;
   a bottom bracket, located under the metal elastic board and located above the lower case, wherein the bottom bracket comprises at least one protruding part and the at least one protruding part supports the metal elastic board main body; and
   a restoration unit, supporting the circuit board;
   wherein the bottom bracket further comprises at least one hole, and the at least one hole is located on the at least one protruding part;
   at least one ground solder pad, wherein the at least one ground solder pad passes through the at least one hole to connect to the metal elastic board main body.

2. The click pad as claimed in claim 1, further comprising a first adhesive layer, and the first adhesive layer is located between the top board and the circuit board.

3. The click pad as claimed in claim 2, further comprising a second adhesive layer, wherein the second adhesive layer is located between the protruding part and the metal elastic board main body.

4. The click pad as claimed in claim 3, wherein the at least one conductive connection layer is a solder paste attached on the at least one connection part via executing Surface-Mount Technology to the at least one connection part.

5. An electronic device, comprising: an upper case; a lower case; and
   a click pad, comprising:
      a top board, located under the upper case;
      a circuit board, located under the top board and connected to the top board;
      a metal elastic board, located under the circuit board, wherein the metal elastic board comprises:
         a metal elastic board main body, wherein a buffer gap is formed between the metal elastic board main body and the circuit board, and the buffer gap provides a buffer function to prevent a pressing force causing an excessive deformation; and
         at least one connection part, connected to the metal elastic board main body;

at least one conductive connection layer, connected to the at least one connection part and the circuit board;

a bottom bracket, located under the metal elastic board and located above the lower case, wherein the bottom bracket comprises at least one protruding part, and the at least one protruding part supports the metal elastic board main body; and a restoration unit, supporting the circuit board;

wherein the bottom bracket further comprises at least one hole, and the at least one hole is located on the at least one protruding part;

wherein the click pad further comprises at least one ground solder pad, and the at least one ground solder pad passes through the at least one hole to connect to the metal elastic board main body.

6. The electronic device as claimed in claim 5, wherein the click pad further comprises a first adhesive layer, and the first adhesive layer is located between the top board and the circuit board.

7. The electronic device as claimed in claim 6, wherein the click pad further comprises a second adhesive layer, and the second adhesive layer is located between the protruding part and the metal elastic board main body.

8. The electronic device as claimed in claim 7, wherein the at least one conductive connection layer is a solder paste attached on the at least one connection part via executing Surface-Mount Technology to the at least one connection part.

* * * * *